United States Patent
Murade

(10) Patent No.: US 7,335,913 B2
(45) Date of Patent: Feb. 26, 2008

(54) ELECTRO-OPTICAL DEVICE AND ELECTRONIC APPARATUS

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 106 days.

(21) Appl. No.: 11/223,919

(22) Filed: Sep. 13, 2005

(65) Prior Publication Data

US 2006/0102906 A1    May 18, 2006

(30) Foreign Application Priority Data

Nov. 12, 2004   (JP)   ............................. 2004-328982

(51) Int. Cl.
*H01L 29/04*   (2006.01)
(52) U.S. Cl. ............................ 257/59; 257/57; 257/79; 257/66
(58) Field of Classification Search .................. 257/59, 257/57, 66, 79
See application file for complete search history.

(56) References Cited

U.S. PATENT DOCUMENTS

2003/0122979 A1 *   7/2003   Morimitsu ................... 349/42

2005/0105036 A1 *   5/2005   Murakami ................... 349/150

FOREIGN PATENT DOCUMENTS

| JP | A 09-113906 | 5/1997 |
| JP | A-2004-354969 | 12/2004 |
| KR | 1999-009398 A | 2/1999 |
| KR | 10-2004-0094339 A | 11/2004 |

* cited by examiner

*Primary Examiner*—Long Pham
(74) *Attorney, Agent, or Firm*—Oliff & Berridge, PLC

(57) ABSTRACT

An electro-optical device includes a pair of substrates that are disposed to face each other with a predetermined gap therebetween, one substrate of the pair of substrates extending from the other substrate on at least one side in plan view, display electrodes that are provided on one substrate, a circuit unit that is provided on one substrate so as to drive the display electrodes, a plurality of lead wiring lines that are led from one of the sides of wiring lines for driving the circuit unit or the display electrodes to an extending portion extending on the one side of one substrate, and a plurality of external connecting terminals that are correspondingly connected to the plurality of lead wiring lines and are provided on a surface of the extending portion facing the other substrate so as to at least partially overlap the plurality of lead wiring lines in plan view.

11 Claims, 13 Drawing Sheets

ELECTRO-OPTICAL DEVICE AND ELECTRONIC APPARATUS

BACKGROUND

This application claims the benefit of Japanese Patent Application No. 2004-328982 filed Nov. 12, 2004. The entire disclosure of the prior application is hereby incorporated by reference herein its entirety.

1. Technical Field

The present invention relates to an electro-optical device, such as a liquid crystal device or the like, and to an electronic apparatus, such as a liquid crystal projector or the like, having such an electro-optical device.

2. Related Art

In such an electro-optical device, a substrate, on which display electrodes and a circuit unit for driving the display electrodes are provided, and a counter substrate are disposed to face each other with an electro-optical material, such as liquid crystal, interposed therebetween. More specifically, the substrates are disposed to face each other with a predetermined gap therebetween and edges of opposite surfaces of the substrates are bonded to each other by a sealant so as to form an internal space, and the electro-optical material is sealed in the internal space.

The substrate provided with the display electrodes extends from the counter substrate on one side in plan view, and external connecting terminals are provided in a portion extending on one side (hereinafter, referred to as an extending portion). The external connecting terminals are connected to wiring lines led from a circuit unit and the like, and are provided such that surfaces thereof are exposed to the outside so as to be supplied with signals or power from the outside. In addition, a driving circuit, which is connected to the external connecting terminals for supplying image signals, is generally provided in the extending portion.

In contrast, for example, as disclosed in JP-A-9-113906, according to a configuration in which a driving circuit is disposed in the internal space and only external connecting terminals are provided in the extending portion, the width of the extending portion can be made narrow, and thus the size of the substrate can be reduced.

However, in an actual electro-optical device, it is difficult to provide a space sufficient to dispose the driving circuit and to lead the wiring lines from the driving circuit in the internal space. Further, even when only the external connecting terminals are provided in the extending portion, at least some of the lead wiring lines connected to the external connecting terminals is substantially disposed in the extending portion. For this reason, in order to reduce the width of the extending portion, the layout of the external connecting terminals and the lead wiring lines needs to be considered.

SUMMARY

An advantage of some aspects of the invention is that it provides an electro-optical device which can reduce the size of a substrate and an electronic apparatus having such an electro-optical device.

According to a first aspect of the invention, an electro-optical device includes a pair of substrates that are disposed to face each other with a predetermined gap therebetween, one substrate of the pair of substrates extending from the other substrate on at least one side in plan view, display electrodes that are provided on one substrate, a circuit unit that is provided on one substrate so as to drive the display electrodes, a plurality of lead wiring lines that are led from one of the sides of wiring lines for driving the circuit unit or the display electrodes to an extending portion extending on the one side of one substrate, and a plurality of external connecting terminals that are correspondingly connected to the plurality of lead wiring lines and are provided on a surface of the extending portion facing the other substrate so as to at least partially overlap the plurality of lead wiring lines in plan view.

In accordance with the first aspect of the invention, the pair of substrates are disposed to face each other with a predetermined gap therebetween and one substrate extends from the other substrate on at least one side. On one substrate extending from the other substrate of the pair of substrates, for example, wiring lines, such as scanning lines, data lines, and the like, electronic elements, such as thin film transistors (hereinafter, referred to as a "TFTs") and the like, and the circuit unit that drives display electrodes by means of a data line driving circuit or a scanning line driving circuit are provided. The display electrodes are formed on an upper layer of one substrate.

Further, in the extending portion extending the other substrate on the one side, the external connecting terminals, which are electrically connected to the circuit unit, are provided. A plurality of external connecting terminals are arranged, for example, along an outer edge of the extending portion, and are correspondingly connected to the lead wiring lines, which are led from the circuit unit or the display electrodes. The lead wiring lines are generally relayed in a region other than a region where the external connecting terminals are arranged.

In the extending portion of the first aspect of the invention, the external connecting terminals and the lead wiring lines are arranged to at least partially overlap each other in plan view (that is, in a three-dimensional manner in the extending portion). Such a configuration is implemented by electrically connecting at least some of the lead wiring lines and the external connecting terminals to each other via contact holes or the like, for example, and by laminating them with an interlayer insulating film interposed therebetween. In this case, two or more conductive films serving as wiring lines or terminals may be laminated. Further, each conductive film may have a single-layered structure or a multi-layered structure.

As such, with the design of the layout, the width of the extending portion in the extension direction thereof can be reduced. As a result, with the reduced size of the substrate, the space of the electro-optical device can be saved. In particular, the number of electro-optical devices which can be manufactured per one wafer can be increased, such that considerable effects for reduction of manufacturing costs and enhancement of manufacturing efficiency are shown. For example, even when the reduced size for one substrate is relatively small, for example, 1 mm or so, if several substrates to several tens or hundreds of substrates are arranged on the same wafer, there is a case in which one row or a plurality of rows of electro-optical devices can be further manufactured on the same wafer. Therefore, it is markedly advantageous in practice.

In the electro-optical device of the first aspect of the invention, it is preferable that the external connecting terminals and the lead wiring lines be laminated with an interlayer insulating film interposed therebetween, the external connecting terminals have the same film as a first conductive film constituting the circuit unit, and the lead wiring lines have the same film as a second conductive film constituting the circuit unit.

According to this configuration, the external connecting terminals and the lead wiring lines are formed with different conductive films laminated with an interlayer insulating film interposed therebetween. Therefore, the external connecting terminals and the lead wiring lines can be constituted so as to overlap in plan view but not to be electrically connected to each other in portions other than portions where connected each other via contact holes or the like.

Further, the external connecting terminals and the lead wiring lines are formed as the same film as a conductive film constituting the circuit unit or to include the same film as such a conductive film, such that the laminate structure of the external connecting terminals and the lead wiring lines does not need to be prepared separately from the circuit unit. Therefore, the structure on the substrate can be simplified and be relatively easily formed. Moreover, as a material of the conductive film, for example, aluminum (Al) having low resistance is suitably used.

Further, in the electro-optical device of the first aspect of the invention, it is preferable that the plurality of external connecting terminals be arranged in a direction along the one side, and the plurality of lead wiring lines extend in the direction along the one side and be connected to edges of the external connecting terminals in a direction intersecting the direction along the one side.

According to this configuration, the plurality of lead wiring lines extend in the direction in which the plurality of external connecting terminals are arranged, such that the external connecting terminals and the lead wiring lines intersect each other in a three-dimensional manner. The external connecting terminals and the lead wiring lines are connected, for example, via contact holes at the edges of the external connecting terminals (that is, the edges of the external connecting terminals on an outer edge side and an inner edge side) in the direction intersecting the direction along the one side. According to such a layout, the lead wiring lines can be efficiently arranged in a region where the external connecting terminals are formed. Further, since the lead wiring lines are connected to the external connecting terminals in a region distant from the region where the lead wiring lines extend, such that the external connecting terminals and other lead wiring lines adjacent to the lead wiring lines to be originally connected to the external connecting terminals can be prevented from being electrically connected to each other due to an error in formation location of the contact hole, for example. Therefore, the liquid crystal device according to the above-described configuration can be manufactured with high reliability.

Further, in the electro-optical device of the first aspect of the invention, it is preferable that the plurality of external connecting terminals be arranged in a direction along the one side, and the plurality of lead wiring lines extend in the direction along the one side and be correspondingly connected to the external connecting terminals in a region where the lead wiring lines and the external connecting terminals intersect each other in plan view.

According to this configuration, the external connecting terminals and the lead wiring lines are correspondingly connected to each other via contact holes, for example, in the region where they intersect each other in plan view. With such a layout, the lead wiring lines can be efficiently arranged in the region where the external connecting terminals are formed, and the lead wiring lines are correspondingly connected to the external connecting terminals in the region where the lead wiring lines extend. Therefore, the regions for forming the contact holes do not need to be separately prepared, and thus the arrangement space of the lead wiring lines and the external connecting terminals can be made small. As a result, according to the above-described configuration, the width in the direction in which the extending portion extends can be further reduced, and thus the size of the substrate can be further reduced.

Further, according to a second aspect of the invention, an electro-optical device includes a pair of substrates that are disposed to face each other with a predetermined gap therebetween, one substrate of the pair of substrates extending from the other substrate on at least one side in plan view, display electrodes that are provided on one substrate, a circuit unit that is provided on one substrate so as to drive the display electrodes, a plurality of lead wiring lines that are led from one of the sides of wiring lines for driving the circuit unit and the display electrodes to an extending portion extending on the one side of one substrate, and a plurality of external connecting terminals that are correspondingly connected to the plurality of lead wiring lines and are provided on a surface of the extending portion facing the other substrate so as to at least partially overlap the circuit unit in plan view.

In accordance with the second aspect of the invention, in the extending portion, the circuit unit and the external connecting terminals are disposed to at least partially overlap each other in plan view. Such a configuration can be implemented by laminating the circuit unit and at least some of the external connecting terminals with an interlayer insulating film interposed therebetween. In this case, two or more conductive films serving as wiring lines or terminals may be laminated. Further, each conductive film may have a single-layered structure or a multi-layered structure.

As such, with the design of the layout, the width of the extending portion in the extending direction thereof can be reduced. As a result, with the reduced size of the substrate, the same effects as those in the electro-optical device according to the first aspect of the invention can be obtained.

In the electro-optical device of the second aspect of the invention, it is preferable that the circuit unit be electrically connected to terminals for supplying an image signal among the plurality of external connecting terminals and have a driving circuit, which is driven by the supplied image signal, and at least a part of the driving circuit overlap the external connecting terminals in plan view.

According to this configuration, the driving circuit, that is, a so-called data line driving circuit is disposed to at least partially overlap the external connecting terminals in plan view. In general, the data line driving circuit is provided to extend along the one side and is connected to the external connecting terminals via the lead wiring lines, such that image signals can be supplied to both ends thereof. For this reason, since a region sufficient to arrange the plurality of lead wiring lines around the data line driving circuit is required, there are many cases in which the data line driving circuit is provided in the extending portion having little spatial restriction, together with the external connecting terminals. In this case, the external connecting terminals and the data line driving circuit are generally provided on the same plane, so that the width of the extending portion becomes large according to the size, the shape, and the like of the data line driving circuit.

In contrast, in the invention, since the entire data line driving circuit provided in the extending portion or at least a part thereof, and the external connecting terminals are provided in the same space, the width of the extending portion can be reduced, and thus the space of the electro-optical device can be effectively saved or the size of the electro-optical device can be effectively reduced.

Further, in the electro-optical device of the second aspect of the invention, it is preferable that the external connecting terminals and the part of the circuit unit be laminated with an interlayer insulating film interposed therebetween, and the external connecting terminals have the same film as a first conductive film constituting the circuit unit.

According to this configuration, since the external connecting terminals and the circuit unit are laminated with the interlayer insulating film interposed therebetween, the external connecting terminals and the circuit unit can overlap in plan view but can not be electrically connected to each other. In addition, the external connecting terminals are formed as the same film as the conductive film constituting the circuit unit or to include the same film as the conductive film, so that the structure on the substrate can be simplified and relatively easily formed. Moreover, as a material of the conductive film, for example, aluminum (Al) having low resistance is suitably used.

The electro-optical device of the first aspect of the invention may further include a sealant that bonds edges of opposite surfaces of the pair of substrates to each other so as to form an internal space between the pair of substrates, and an electro-optical material that is held in the internal space. In addition, it is preferable that the display electrodes and the part of the circuit unit be disposed to face the internal space.

According to this configuration, the edges of the opposite surfaces of the pair of substrates are bonded to each other by the sealant so as to form the internal space therebetween, and the extending portion extends from the edges. The electro-optical material, such as liquid crystal, is sealed into the internal space. The display electrodes are disposed to face the internal space. Further, a part of the circuit unit, for example, wiring lines or elements, such as scanning lines, data lines, TFTs, and the like, and a driving circuit, such as a scanning line driving circuit or the like, is provided in the region facing the internal space, together with the display electrodes. Therefore, almost the entire area of the extending portion can be used for forming the external connecting terminals.

According to a third aspect of the invention, an electronic apparatus includes the above-described electro-optical device (including various configurations).

According to this configuration, since the electronic apparatus includes the above-described electro-optical device, various electronic apparatuses, such as a projection type display device, a liquid crystal television, a cellular phone, an electronic organizer, a word processor, a viewfinder-type or monitor-direct-view-type video tape recorder, a workstation, a video phone, a POS terminal, a touch panel, and the like, which are saved in space and reduced in size, can be implemented. In addition, for example, an electrophoretic device, such as an electronic paper, can be implemented as the electronic apparatus according to the third aspect of the invention.

Such effects and other advantages of the invention will be apparent from the following embodiments to be described below.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings.

Embodiments of Electro-Optical Device

The embodiments of the invention will be described with reference to FIGS. 1 to 13. In the embodiments to be described below, the electro-optical device of the invention is applied to a liquid crystal device.

First Embodiment

A liquid crystal device according to a first embodiment of the invention will be described with reference to FIGS. 1 to 7.

Schematic Configuration of Liquid Crystal Device

Figure 1:
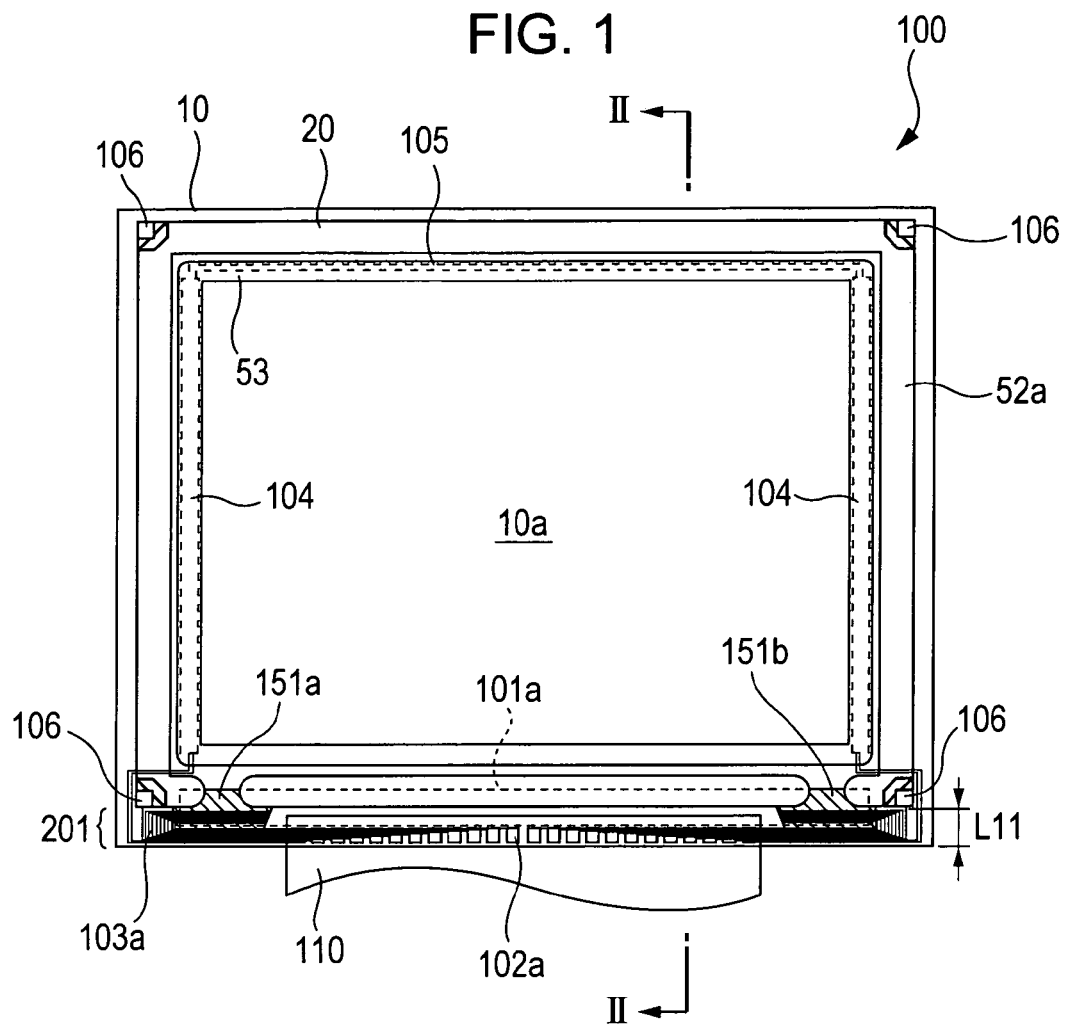
FIG. 1 is a plan view showing a configuration of a liquid crystal device according to a first embodiment of the invention.
Figure 2:
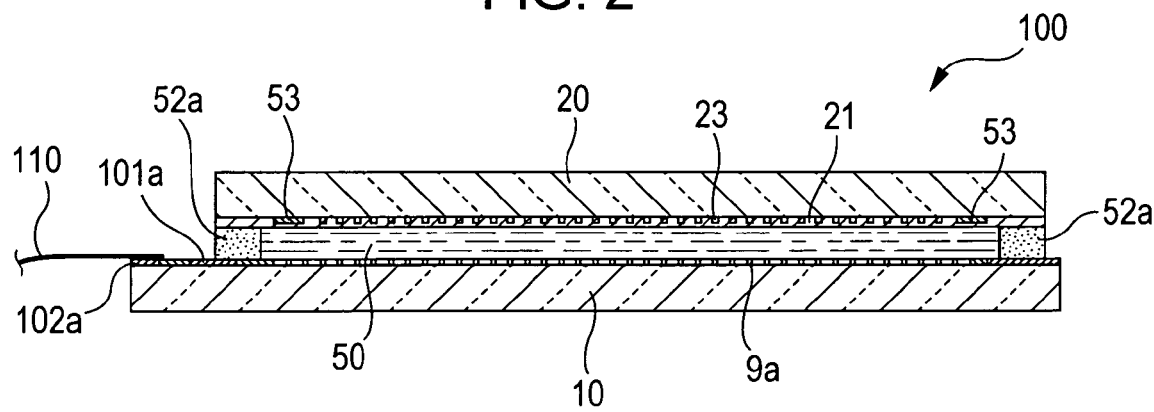
FIG. 2 is a cross-sectional view showing the liquid crystal device taken along the line II-II of FIG. 1.
Figure 3:
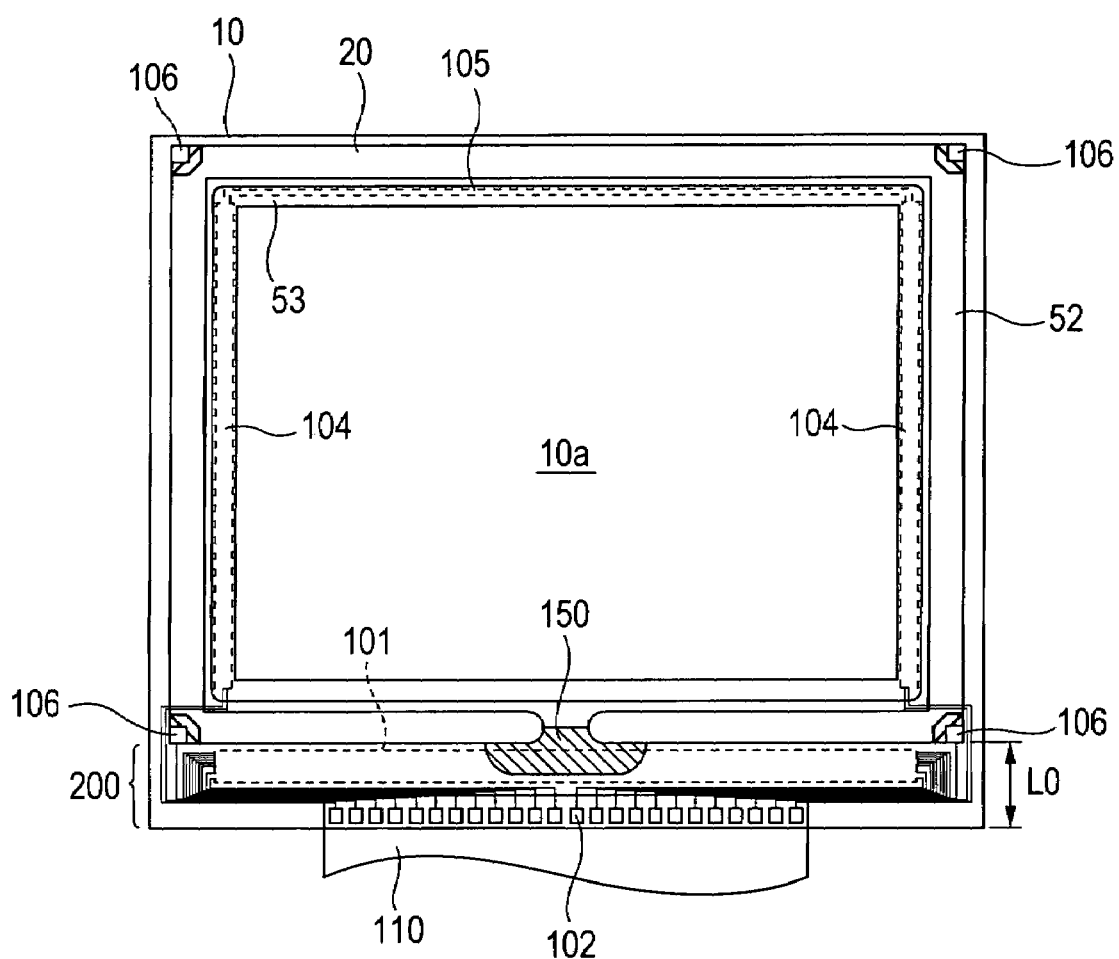
FIG. 3 is a plan view showing a comparative example of the liquid crystal device according to the first embodiment.

First, the schematic configuration of a liquid crystal device will be described with reference to FIGS. 1 to 3. FIG. 1 is a plan view showing the configuration of a liquid crystal device according to the present embodiment, and FIG. 2 is a cross-sectional view taken along the line II-II of FIG. 1. FIG. 3 shows a comparative example of the liquid crystal device according to the present embodiment.

Referring to FIGS. 1 and 2, in the liquid crystal device 100, a TFT array substrate 10 and a counter substrate 20 are disposed to face each other with a predetermined gap therebetween and edges of opposite surfaces of both substrates are bonded to each other by a sealant 52a so as to form an internal space. The TFT array substrate 10 has an extending portion 201 which extends from the counter substrate 20 on one side in plan view, and the sealant 52a defines openings which lead to the internal space at predetermined places of a side where the extending portion 201 extends (here, both ends of the side). Further, a liquid crystal layer 50 is formed by injecting liquid crystal into the internal space through the openings, and the openings are sealed with sealing mold materials 151a and 151b. A frame light-shielding film 53, which is provided along an inner edge of the sealant 52a, defines an image display region 10a on which images are displayed.

On the image display region 10a of a surface (top surface in FIG. 2) of the TFT array substrate 10 facing the counter substrate 20, pixel electrodes 9a, which are examples of 'display electrodes' of the invention, are provided on switching TFTs or wiring lines, such as scanning lines, data lines, and the like. In addition, an alignment film is formed just above the pixel electrodes 9a. On a surface (bottom surface in FIG. 2) of the counter substrate 20 facing the TFT array substrate 10, a counter electrode 21 is formed via a stripe-shaped light-shielding film 23, and an alignment film is formed on the counter electrode 21. Further, in at least one corner portion (here, all of four corner portions) of the counter substrate 20, vertical connecting terminals 106 for electrically connecting the counter substrate 20 and the TFT array substrate 10 are provided. The alignment state of liquid crystal of the liquid crystal layer 50 changes according to the electric field applied between the pixel electrodes 9a and the counter electrode 21, but liquid crystal of the liquid crystal layer 50 maintains an initial alignment state defined by the alignment films when the electric field is not applied.

In a region of the surface of the TFT array substrate 10 facing the counter substrate 20 which corresponds to a region where the frame light-shielding film 53 is formed, scanning line driving circuits 104 for driving scanning lines, and wiring lines 105 are provided. In FIG. 1, two scanning line driving circuits 104 are provided on left and right sides the frame light-shielding film 53. The wiring lines 105 are relayed on the upper side of the frame light-shielding film 53 so as to connect the two scanning line driving circuits 104.

The extending portion 201 of the TFT array substrate 10 is provided with a data line driving circuit 101a for driving data lines, which is a specified example of 'driving-circuit' of the invention, along a lower side of the sealant 52a in FIG. 1. The upper half of the data line driving circuit 101a overlaps the sealant 52a in plan view. Further, the lower half of the data line driving circuit 101a overlaps portions pushed from the openings of the sealing mold materials 151a and 151b at both ends thereof.

Moreover, in the present embodiment, all of electronic elements, such as TFTs or the like, the wiring lines, such as scanning lines, data lines, and the like, and circuits on the TFT array substrate 10 including the scanning line driving circuits 104 and the data line driving circuit 101a correspond to a specified example of 'circuit unit' of the invention. Further, the extending portion 201 may be further provided with a sampling circuit that applies image signals to a plurality of data lines with a predetermined timing, a precharge circuit that supplies a precharge signal having a predetermined voltage level to the plurality of data lines prior to the image signals, and a test circuit that tests quality, defects, or the like of the liquid crystal device 100 during manufacture or at the time of shipping.

Further, in the present embodiment, at least some of a plurality of lead wiring lines 103a in the extending portion 201 is provided to overlap external connecting terminals 102a in plan view. Specifically, in the liquid crystal device 100, a layer where the external connecting terminals 102a are formed and a layer where the lead wiring lines 103a are formed are laminated with, for example, an interlayer insulating film interposed therebetween, and the formation region of the external connecting terminals 102a and the formation region of the lead wiring lines 103a at least partially overlap each other. Two or more conductive films serving as wiring lines or terminals may be laminated. Further, each conductive film may have a single-layered structure or a multi-layered structure.

The external connecting terminals 102a are provided so as to supply power or signals to the liquid crystal device 100 from an external circuit, which is connected thereto via an FPC 110. The external connecting terminals 102a are properly connected to the driving circuit, such as the scanning circuit driving circuits 104 or the data line driving circuit 101a, via the lead wiring lines 103a. In the liquid crystal device 100, the pixel electrodes 9a are driven by signals inputted to the external connecting terminals 102a from the outside, such that images are displayed. Here, the data line driving circuit 101a is connected to the plurality of external connecting terminals 102a through the lead wiring lines 103a at both ends of the extending portion 201.

As shown in FIG. 3, in a liquid crystal device according to a comparative example of the present embodiment, external connecting terminals 102 and lead wiring lines 103 are disposed on the same plane so as not to overlap each other in plan view. In addition, the external connecting terminals 102 must be connected to the FPC 110, and thus a sealant 150 does not overlap the external connecting terminals 102. Accordingly, the external connecting terminals 102a need to be disposed away from the sealant 150 to some extent. As a result, an extending portion 200 has a predetermined width L0 and has a space, such that a space for disposing the entire data line driving circuit 101 is generated.

In contrast, in the liquid crystal device 100 of the present embodiment, as described above, at least some of the plurality of lead wiring lines 103a are disposed to overlap the external connecting terminals 102a in plan view, so that a space can be saved. In particular, since the external connecting terminals 102a are arranged along an outer edge of the extending portion 201, the width L11 of the extending portion 201 in the extending direction can be reduced further than the related art.

Further, in the liquid crystal device 100 of the present embodiment, since the external connecting-terminals 102a are arranged in a region between the sealing mold materials 151a and 151b, the external connecting terminals 102a do not need to be provided distant from and the sealing mold materials 151a and 151b. In addition, in FIG. 1, the positions of the external connecting terminals 102a can be moved upward by disposing the upper half of the data line driving circuit 101a in a region where the sealant 52a is provided. As a result, the width L11 of the extending portion 201 can be further reduced than the width L0 of the extending portion 200 in the comparative example.

As such, the space can be saved in the liquid crystal device 100 of the present embodiment, and thus an electronic apparatus, to which the liquid crystal device 100 is applied, can have a high degree of freedom in terms of design. Further, the number of liquid crystal devices which can be manufactured per one wafer can be increased, and considerable effects for reduction of manufacturing costs and enhancement of manufacturing efficiency are shown. That is, even though the reduced width of the extending portion 201 in one liquid crystal device 100 is small, several hundreds or thousands of regions, each corresponding to the TFT array substrate 10, are generally formed on the wafer and a large number of such wafers are manufactured. Therefore, it is very effective for manufacture.

Here, on the lower side of the sealant 52a or the lower side of the counter substrate 20, the openings and the sealing mold materials 150a and 150b are disposed at the ends thereof and the external connecting terminals 102a are arranged at a central portion thereof. Therefore, even when the lead wiring lines 103a are divided into the left and right sides, the lengths of the lead wiring lines 103a can be approximately equal one left and right sides, such that a failure, such as a signal delay between the left and right sides, does not occur. Further, the openings are disposed at the left and right ends, so that liquid crystal can be injected into the internal space efficiently and uniformly.

Configuration of Extending Portion

Figure 4:
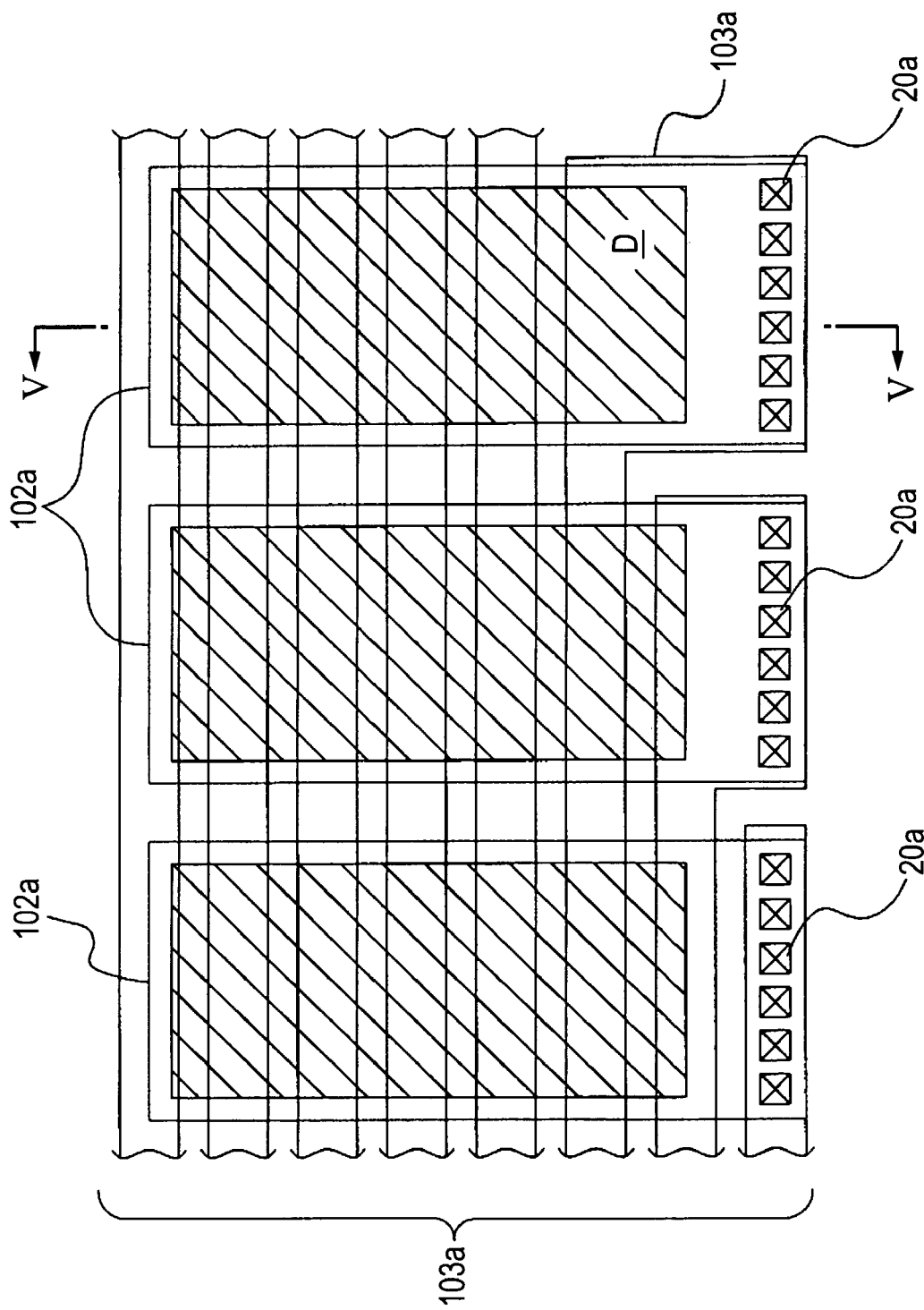
FIG. 4 is a plan view showing a configuration of main parts of the liquid crystal device according to the first embodiment.
Figure 5:
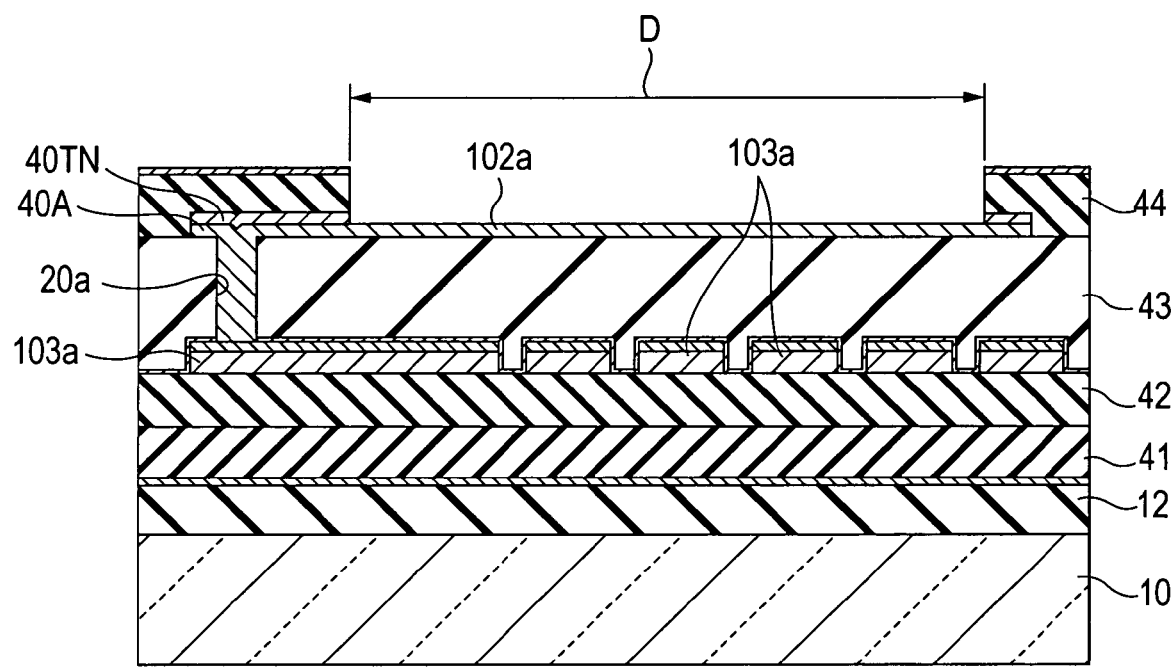
FIG. 5 is a cross-sectional view showing an extending portion taken along the line V-V of FIG. 4.
Figure 6:
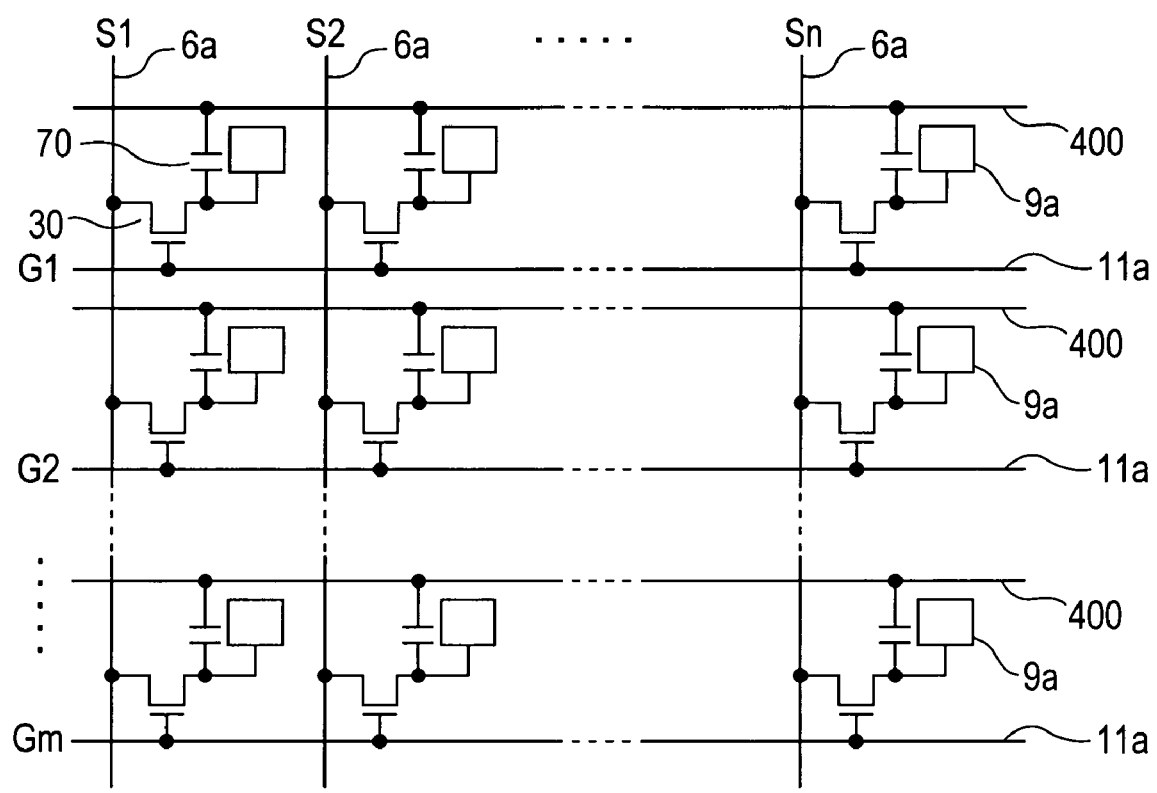
FIG. 6 is a schematic view showing an equivalent circuit in an image display region of the liquid crystal device according to the first embodiment.
Figure 7:
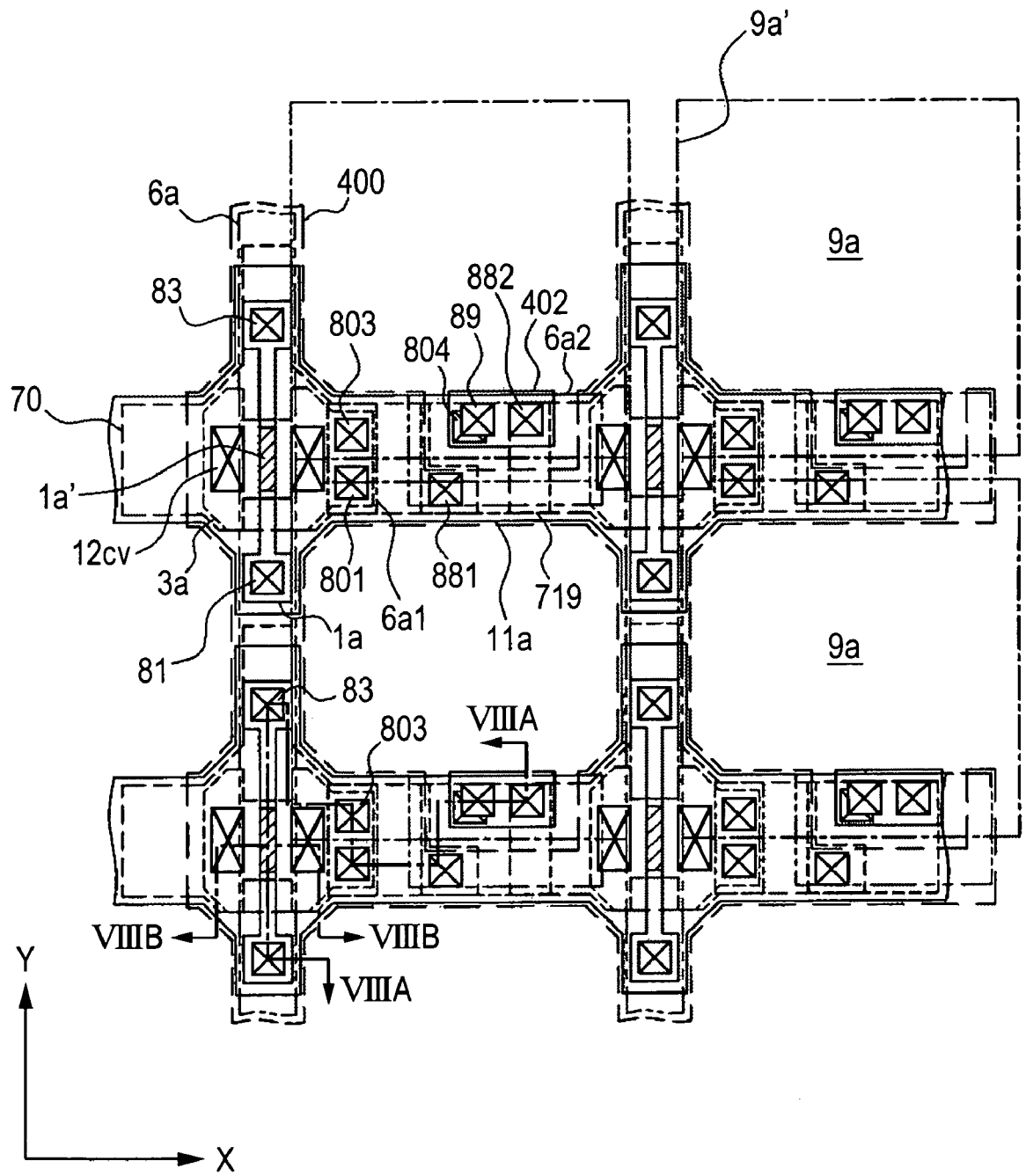
FIG. 7 is a plan view showing a configuration of the image display region of the liquid crystal device according to the first embodiment.
Figure 8B:
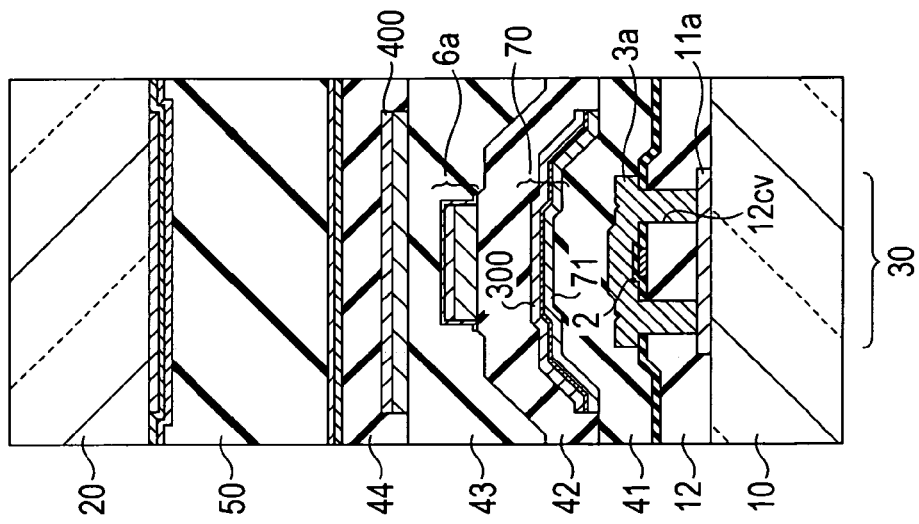
FIG. 8B is a cross-sectional view showing the configuration of the image display region of the liquid crystal device according to the first embodiment taken along the line VIIIB-VIIIB of FIG. 7.
Figure 8A:
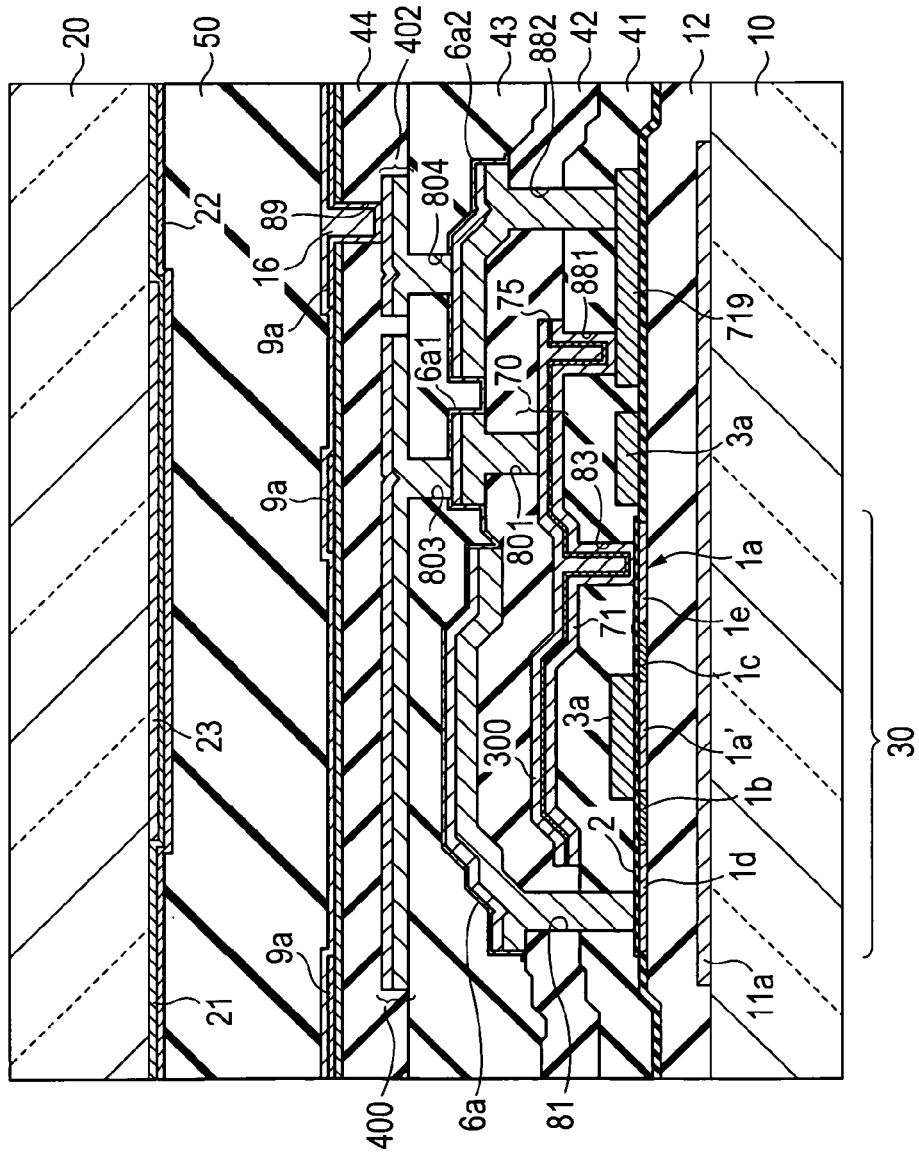
FIG. 8A is a cross-sectional view showing the configuration of the image display region of the liquid crystal device according to the first embodiment taken along the line VIIIA-VIIIA of FIG. 7.

Next, referring to FIGS. 4 to 7, a specified configuration of the extending portion 201 in the liquid crystal device 100 will be described in detail. FIG. 4 shows main parts of the extending portion in the liquid crystal device according to the present embodiment on a magnified scale. FIG. 5 is a cross-sectional view taken along the line V-V of FIG. 4. FIG. 6 shows an equivalent circuit constituted by a pixel unit in an image display region of the liquid crystal device according to the present embodiment. FIG. 7 is a plan view showing the configuration of the pixel unit. FIGS. 8A and 8B are cross-sectional views showing the configuration of the pixel unit. Specifically, FIG. 8A is a cross-sectional view taken along the line VIIIA-VIIIA of FIG. 7, and FIG. 8B is a cross-sectional view taken along the line VIIIB-VIIIB of FIG. 7. In FIGS. 8A and 8B, the scale of each layer or each member has been adjusted in order to have a recognizable size.

In FIG. 4, the plurality of external connecting terminals 102a are arranged in one direction, and the plurality of lead wiring lines 103a extend in the direction in which the external connecting terminals 102a are arranged and are connected to the external connecting terminals 102a via contact holes 20a. The plurality of contact holes 20a are provided at the outer edges of the plurality of external connecting terminals 102a. Alternatively, all or some of the contact holes 20a may be provided at the inner edges of the plurality of external connecting terminals 102a.

According to such a layout, the lead wiring lines 103a are connected to the external connecting terminals 102a in a region distant from a region where the lead wiring lines 103a extend, so that the external connecting terminals 102a and other lead wiring lines 103a adjacent to the lead wiring lines 103a to be originally connected to the external connecting terminals 102a can be prevented from being electrically connected to each other due to an error in formation location of the contact hole 20a, for example. Therefore, the liquid crystal device 100 can be manufactured with high reliability.

In FIG. 5, the external connecting terminals 102a and the lead wiring lines 103 are laminated with an interlayer insulating film 43 interposed therebetween. Further, the contact holes 20a are formed to pass through the interlayer insulating film 43. Each of the lead wiring lines 103a is connected to a desired external connecting terminal 102a via the contact hole 20a but is electrically isolated from other external connecting terminals 102a by means of the interlayer insulating film 43, so that the lead wiring lines 103a overlap the external connecting terminals 102a in plan view.

Here, a base insulating film 12 and interlayer insulating films 41, 42, 43, and 44 are laminated on the TFT array substrate 10 in that order, and the lead wiring lines 103a are provided on the interlayer insulating film 43. Here, the lead wiring line 103a and the external connecting terminal 102a each has a two-layered structure made of an aluminum layer 40A, a titanium nitride film 40TN, and an exposed surface D of each of the external connecting terminals 102a (a hatched region of each of the external connecting terminals 102a in FIG. 4) is exposed to the outside from an opening which is formed by partially removing the interlayer insulating film 44 and the titanium nitride film 40TN. A laminated structure in the image display region 10a on the TFT array substrate 10 is constituted based on the above-described laminated structure. Next, the configuration of the laminated structure in the image display region 10a will be described below.

Configuration of Image Display Region

In FIG. 6, a plurality of scanning lines 11a and a plurality of data lines 6a are arranged to intersect each other in the image display region 10a, and pixel units, each being selected by one of the plurality of scanning lines 11a and one of the plurality of data lines 6a, are formed between these lines. Each of the pixel units has a TFT 30, a pixel electrode 9a, and a storage capacitor 70. The TFT 30 is provided to apply image signals S1, S2, . . . , and Sn supplied from the data lines 6a to the selected pixels. A gate of the TFT 30 is connected to the scanning line 11a, a source thereof is connected to the data line 6a, and a drain thereof is connected to the pixel electrode 9a. A liquid crystal capacitor is formed between the pixel electrode 9a and a counter electrode 21 to be described below, and the respective pixel electrodes 9a hold the input image signals S1, S2, . . . , and Sn for a predetermined period of time. That is, an opening region for each pixel unit is divided by each of the pixel electrodes 9a. One electrode of the storage capacitor 70 is connected to the drain of the TFT 30 in parallel with the pixel electrode 9a, and the other electrode thereof is connected to a fixed-potential capacitor wiring line 400, such that the electric potential on the other electrode can be made constant.

The liquid crystal device 100 uses a TFT active matrix driving method, for example. Specifically, in the liquid crystal device 100, scanning signals G1, G2, . . . , Gm are line-sequentially applied to the respective scanning lines 11a from the scanning line driving circuit 104 (see FIG. 1), and simultaneously the image signals S1, S2, . . . , and Sn supplied from the data line driving circuit 101 (see FIG. 1) are applied through the data lines 6a to a selected row of horizontally-arrayed pixel units in which the TFTs 30 are turned on. As a result, the image signals are supplied to the pixel electrodes 9a corresponding to the selected pixels. Since the TFT array substrate 10 is disposed to face the counter substrate 20 with the liquid crystal layer 50 interposed therebetween (see FIG. 2), the amount of transmitted light between the substrates is controlled for each pixel by applying an electric field to the liquid crystal layer 50 for each pixel unit in such a manner, such that gray-scale display of an image is performed. At this time, the image signal held in each pixel unit is prevented from leaking by means of the storage capacitor 70.

In FIGS. 7 and 8, circuit elements of the above-described pixel unit are patterned to be formed on the TFT array substrate 10 as laminated conductive films. The TFT array substrate 10 of the present embodiment is made of a quartz substrate and is disposed to face the counter substrate 20 made of a glass substrate, a quartz substrate, or the like. Further, each of the circuit elements has a first layer including the scanning line 11a, a second layer including the gate electrode 3a, a third layer including the fixed-potential capacitor electrode of the storage capacitor 70, a fourth layer including the data line 6a, a fifth layer including the capacitor wiring line 400, and a sixth layer including the pixel electrode 9a from the bottom. In addition, the base insulating film 12 is provided between the first and second layers, the first interlayer insulating film 41 is provided between the second and third layers, the second interlayer insulating film 42 is provided between the third and fourth layers, the third interlayer insulating film 43 is provided between the fourth and fifth layers, and the fourth interlayer insulating film 44 is provided between the fifth and sixth layers, such that the above-described elements can be prevented from being short-circuited.

Configuration of First Layer—Scanning Line and the Like

The first layer has the scanning lines 11a. Each of the scanning lines 11a is patterned to have a main line part extending in an X direction of FIG. 7 and a protruding part extending in a Y direction of FIG. 7 in which the data lines 6a or the capacitor wiring lines 400 extend. The scanning line 11a is made of, for example, conductive polysilicon. Alternatively, the scanning line 11a may be made of a metal simplex of at least one high-melting-point metal selected from a group of titanium (Ti), chromium (Cr), tungsten (W), tantalum (Ta), molybdenum (Mo), and the like, an alloy thereof, metal silicide, polysilicide, or a laminate thereof. That is, the scanning line 11a of the present embodiment covers a region between the openings as much as possible, thereby serving as a light-shielding film which shields the TFT 30 from the lower side.

Configuration of Second Layer—TFT and the Like

The second layer has the TFTs 30 and relay electrodes 719. Each of the TFTs 30 has an LDD (Lightly Doped Drain) structure, for example, and includes a gate electrode 3a, a semiconductor layer 1a, and a gate insulating film 2 for electrically isolating the gate electrode 3a from the semiconductor layer 1a. The gate insulating film 2 is made of, for example, an HTO (High Temperature Oxide) or a thermally-oxidized silicon oxide. The gate electrode 3a is made of, for example, conductive polysilicon. The semiconductor layer 1a is made of, for example, polysilicon, and has a lightly-doped source region 1b, a lightly-doped drain region 1c, a heavily-doped source region 1d, and a heavily-doped drain region 1e. In addition, on the second layer, the relay electrodes 719 are formed as the same film as that of the gate electrode 3a.

The gate electrode 3a of the TFT 30 is electrically connected to the scanning line 11a via a contact hole 12cv formed in the base insulating film 12. The base insulating film 12 is made of a silicon oxide film, such as an HTO film or an NSG (non-silicate glass) film, electrically isolates the first layer from the second layer, and is formed on the entire surface of the TFT array substrate 10 so as to prevent element characteristics of the TFT 30 from changing due to roughness or contamination caused by the abrasion of a substrate surface.

Configuration of Third Layer—Storage Capacitor and the Like

The third layer has the storage capacitors 70. Each of the storage capacitors 70 is configured such that a capacitor electrode 300 and a lower electrode 71 are disposed to face each other with a dielectric film 75 interposed therebetween. The capacitor electrode 300 is electrically connected to the capacitor wiring line 400 via contact holes 801 and 803 and a relay layer 6a1 for a capacitor wiring line. The lower electrode 71 and the heavily-doped drain region 1e are connected via a contact hole 83 formed in the first interlayer insulating film 41. Further, the lower electrode 71 and the pixel electrode 9a relay the respective layers by means of contact holes 881, 882, and 804, the relay electrode 719, a second relay electrode 6a2, and a third relay electrode 402, and are electrically connected via a contact hole 89.

The capacitor electrode 300 has a single layer made of a metal simplex of at least one high-melting-point metal selected from a group of Ti, Cr, W, Ta, Mo, and the like, an alloy thereof, metal silicide, polysilicide, or a laminate. Preferably, the capacitor electrode 300 is made of tungsten silicide, and has a function of blocking light incident on the TFT 30 from the top in FIG. 8. The lower electrode 71 is made of conductive polysilicon, for example. The dielectric film 75 is made of, for example, a silicon oxide film, such as an HTO film or an LTO (Low Temperature Oxide) film, or a silicon nitride film, to have a relatively small thickness of approximately 5 to 200 nm.

Further, the first interlayer insulating film 41 is made of, for example, NSG. Alternatively, the first interlayer insulating film 41 may be made of silicate glass, such as PSG (phosphorus silicate glass), BSG (boron silicate glass), BPSG (boron phosphorus silicate glass), a silicon nitride, a silicon oxide, or the like.

Configuration of Fourth Layer—Data Line and the Like

The fourth layer has the data lines 6a, the relay layer 6a1 for a capacitor wiring line, and the second relay electrode 6a2. Each of the data lines 6a has a two-layered structure of an aluminum film and a titanium nitride film, and the surface thereof is covered with a silicon nitride film. The data line 6a is electrically connected to the heavily-doped source region 1d of the TFT 30 via a contact hole 81 passing through the first and second interlayer insulating films 41 and 42. In addition, on the fourth layer, the relay layer 6a1 for a capacitor wiring line and the second relay electrode 6a2 are formed as the same film as that of the data line 6a.

Further, the second interlayer insulating film 42 is made of, for example, NSG. Alternatively, the second interlayer insulating film 42 may be made of silicate glass, such as PSG, BSG, BPSG, or the like, a silicon nitride, a silicon oxide, or the like.

Configuration of Fifth Layer—Capacitor Wiring Line and the Like

The fifth layer has the capacitor wiring lines 400 and the third relay electrode 402. Each of the capacitor wiring lines 400 extends to reach the periphery of the image display region 10a, and is electrically connected to a constant voltage source, from which power is supplied to a peripheral driving circuit or a counter electrode potential is supplied to a counter substrate via the vertical connecting terminal, such that the capacitor wiring line 400 has a constant potential. Further, the capacitor wiring line 400 is electrically connected to the relay layer 6a1 for a capacitor wiring line via the contact hole 803 formed in the third interlayer insulating film 43. The capacitor wiring line 400 has a two-layered structure of, for example, an aluminum film and a titanium nitride film.

The capacitor wiring line 400 has a lattice pattern extending in the X and Y directions, as shown in FIG. 7. A part of the capacitor wiring line 400 extending in the X direction is provided with a notch portion in order to ensure a region for forming the third relay electrode 402. Further, the capacitor wiring line 400 has a width larger than those of the lower data line 6a, the scanning line 11a, and the TFT 30, such that the capacitor wiring line 400 can function as a light-shielding film and cover those circuit elements, thereby finally defining a non-opening region. In addition, on the fifth layer, the third relay electrode 402 is formed as the same film as that of the data line 6a.

Below the fifth layer, the third interlayer insulating film 43 is formed over the entire surface thereof. The third interlayer insulating film 43 is made of, for example, silicate glass, such as NSG, PSG, BSG, BPSG, or the like, a silicon nitride, a silicon oxide, or the like. Further, the surface of the third interlayer insulating film 43 may be planarized by a CMP (Chemical Mechanical Polishing) treatment or a planarizing film formed by an SOG (Spin On Glass) treatment. With the planarization, cracks caused by a step difference between wiring lines can be prevented.

Configuration of Sixth Layer—Pixel Electrode and the Like

The fourth interlayer insulating film 44 is formed on the entire surface of the fifth layer, and the pixel electrodes 9a are formed thereon as the sixth layer. In the fourth interlayer insulating film 44, a contact hole 89 is formed to electrically connect the pixel electrode 9a and the third relay electrode 402. The fourth interlayer insulating film 43 is made of, for example, silicate glass, such as NSG, PSG, BSG, BPSG, or the like, a silicon nitride, a silicon oxide, or the like. Further, the surface of the fourth interlayer insulating film 44 may be planarized by the CMP treatment or a planarizing film formed by the SOG treatment. With the planarization, cracks caused by a step difference between wiring lines can be prevented.

Each of the pixel electrodes 9a (indicated by a dotted line 9a' in FIG. 7) is disposed to approximately correspond to each of the pixel regions partitioned vertically and horizontally. The pixel electrode 9a is made of, for example, a transparent conductive film, such as ITO (Indium Tin Oxide). Further, an alignment film 16 is formed on the pixel electrode 9a. Until now, the configuration of the pixel unit on the TFT array substrate 10 has been described.

Further, with respect to the counter substrate 20, the counter electrode 21 is provided on the entire surface thereof facing the TFT array substrate 10, and an alignment film 22 is formed thereon (below the counter electrode 21 in FIG. 8). The counter electrode 21 is made of, for example, a transparent conductive film, such as ITO, in the same manner as the pixel electrode 9a. Between the counter substrate 20 and the counter electrode 21, a light-shielding film 23 for covering at least a region facing the TFT 30 is provided to prevent optical leakage current from being generated.

In the present embodiment, the extending portion 201 is formed on the extension of such a laminated structure constituting the image display region 10a. That is, in the extending portion 201, the lead wiring lines 103a are formed in the fourth layer as the same film as that of the data line 6a, and the external connecting terminals 102a are formed in the fifth layer as the same film as that of the capacitor wiring line 400. For this reason, a laminated structure shown in FIG. 5, in which the lead wiring lines 103a and the external connecting terminals 102a are laminated with the interlayer insulating film interposed therebetween, does not need to be provided separately from the laminated structure constituting the image display region 10a. Therefore, the structure on the TFT array substrate 10 can be simplified and relatively easily formed.

In addition, in the present embodiment, since both the fourth and fifth layers contain aluminum, the data lines 6a and the capacitor wiring lines 400 have low resistance, and the lead wiring lines 103a and the external connecting terminals 102a have low resistance. Since the fourth and fifth layers are disposed above the storage capacitor 70 or the TFT 30, which requires a heat treatment, aluminum having low thermal resistance can be used. Here, by providing the lead wiring lines 103a and the external connecting terminals 102a in the fourth and fifth layers of the laminated structure constituting the image display region 10a, the wiring lines can have low resistance and the exposed surface D of each of the external connecting terminals 102a can be easily formed.

Modification

Figure 9:
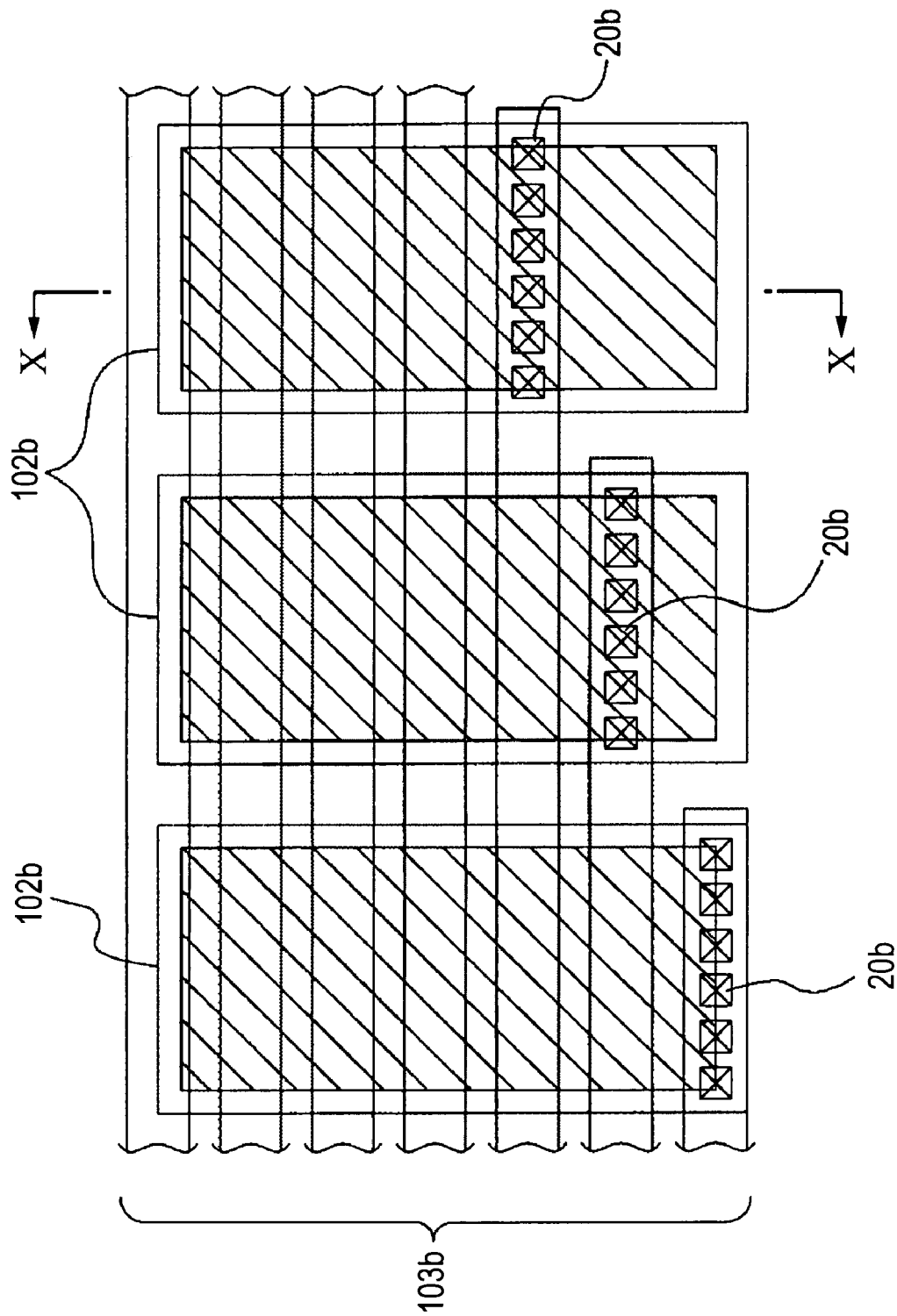
FIG. 9 is a plan view showing a modification of the liquid crystal device according to the first embodiment.
Figure 10:
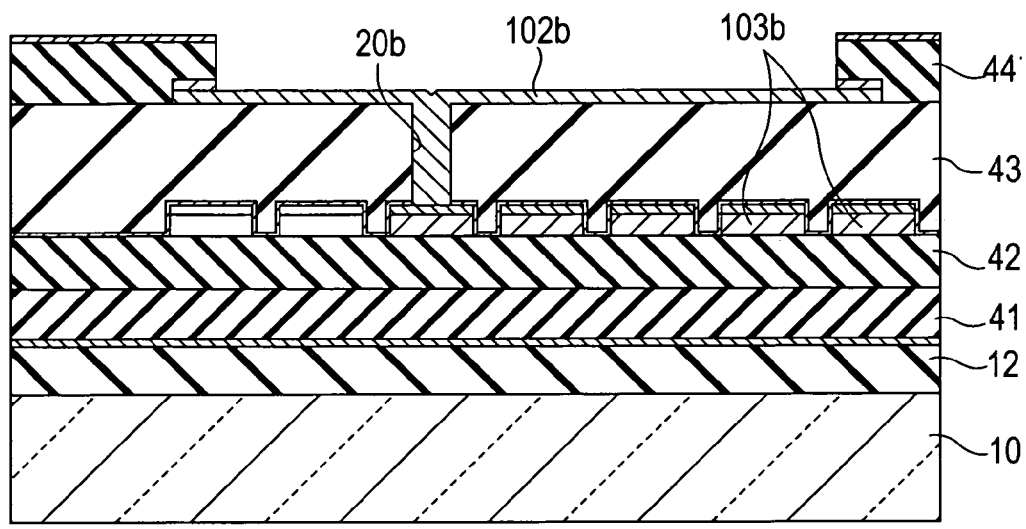
FIG. 10 is a cross-sectional view showing the extending portion taken along the line X-X of FIG. 9.

Next, a liquid crystal device according to a modification of the first embodiment will be described with reference to FIGS. 9 and 10. FIG. 9 shows main parts of the extending portion in the liquid crystal device according to the modification of the first embodiment on a magnified scale. FIG. 10 is a cross-sectional view taken along the line X-X of FIG. 9.

Preferably, the lead wiring lines and the external connecting terminals according to the invention are arranged to partially overlap each other in plan view, and various modifications can be made, in addition to the arrangement of the first embodiment.

FIG. 9 shows an example of such modifications. In FIG. 9, a plurality of external connecting terminals 102b are arranged in one direction and are connected to external connecting terminals 103b via contact holes 20b. Each of the contact holes 20b is provided in each of the regions where the plurality of lead wiring lines 103b and the plurality of external connecting terminals 102b intersect each other in plan view.

With such an arrangement, since the lead wiring lines 103a are connected to the external connecting terminals 102a in the regions where the lead wiring lines 103a extend, separate regions for forming contact holes do not need to be prepared, such that a space where the lead wiring lines and the external connecting terminals are arranged can be made smaller than that in the first embodiment (see FIGS. 5 and 10). Therefore, in the modification, the width of the extending portion can be further reduced, so that the size of the TFT array substrate 10 can be further reduced.

Second Embodiment

Figure 11:
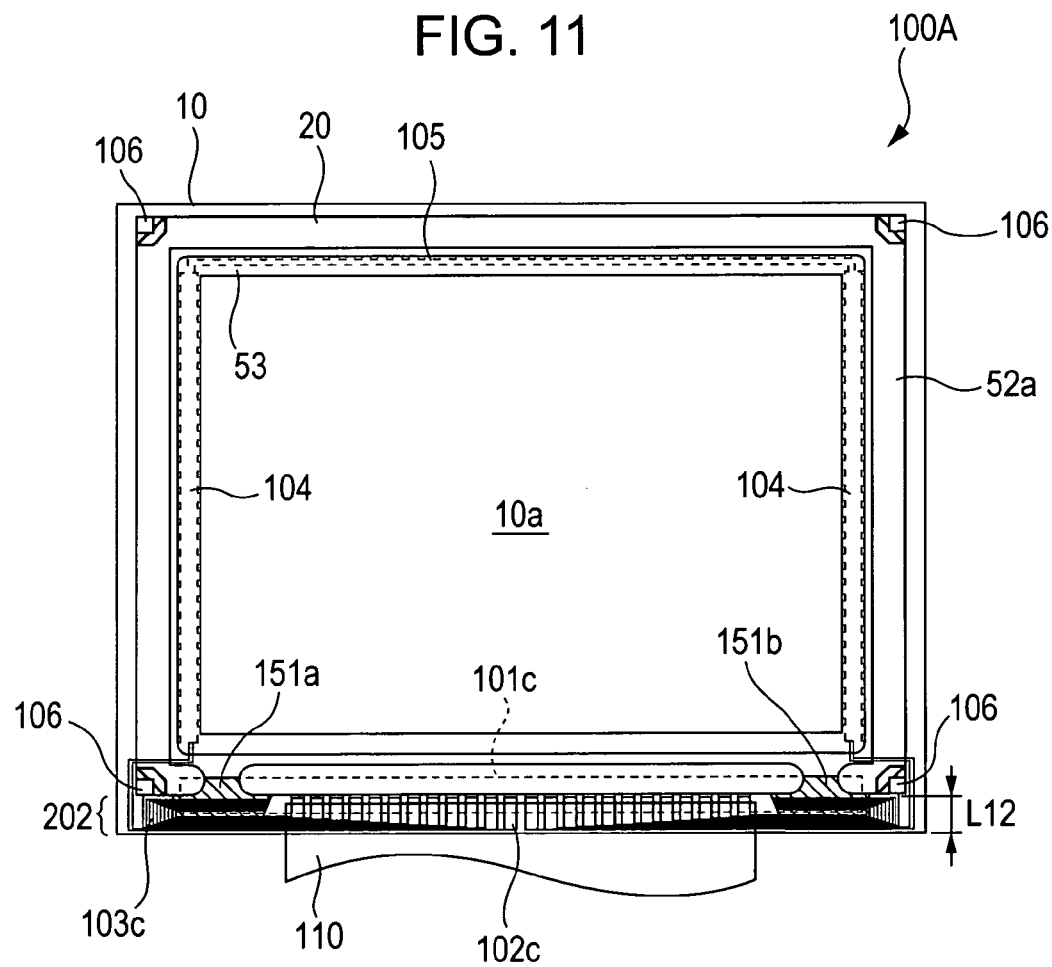
FIG. 11 is a plan view showing a configuration of a liquid crystal device according to a second embodiment.
Figure 12:
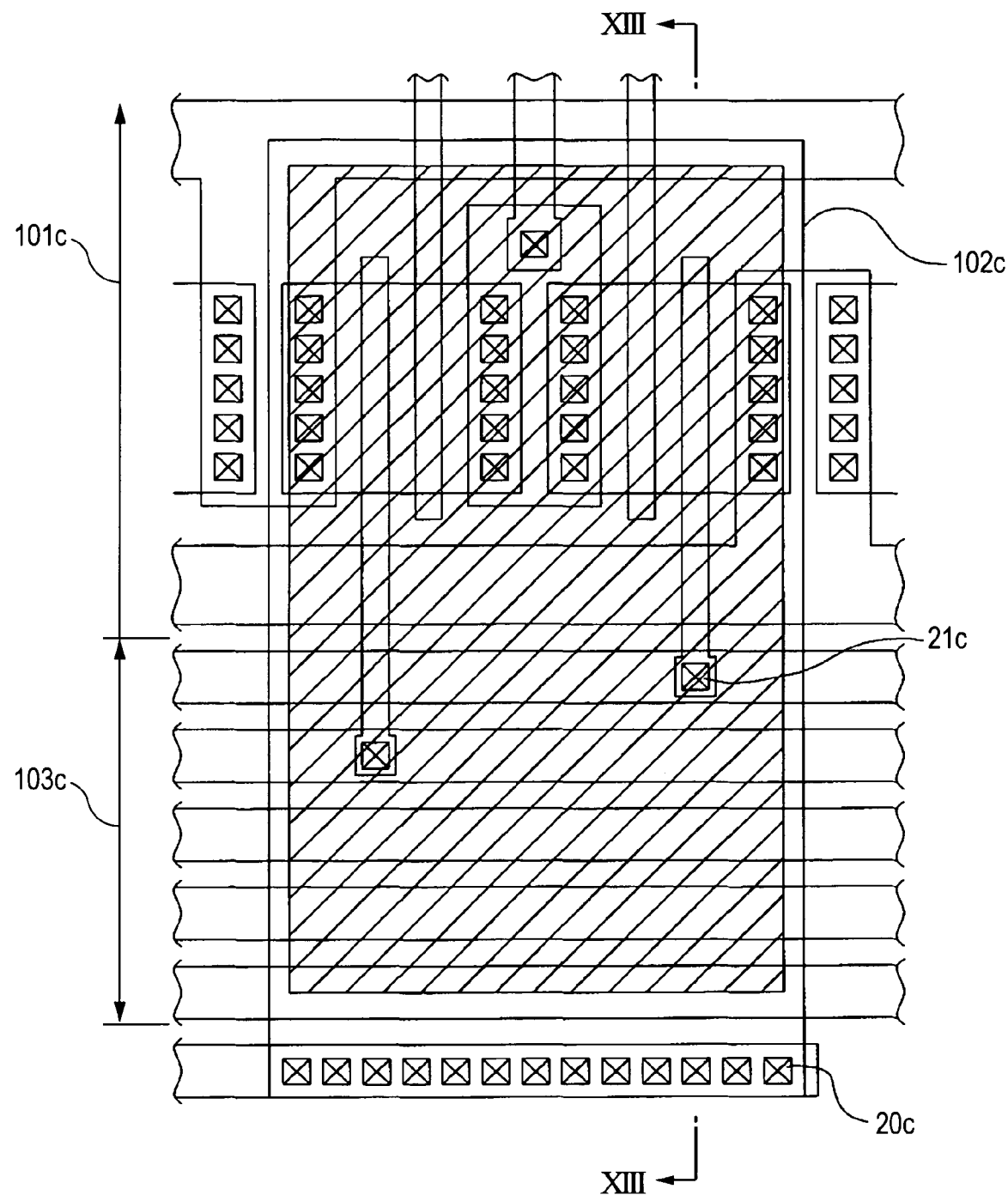
FIG. 12 is a plan view showing a configuration of main parts of the liquid crystal device according to the second embodiment.
Figure 13:
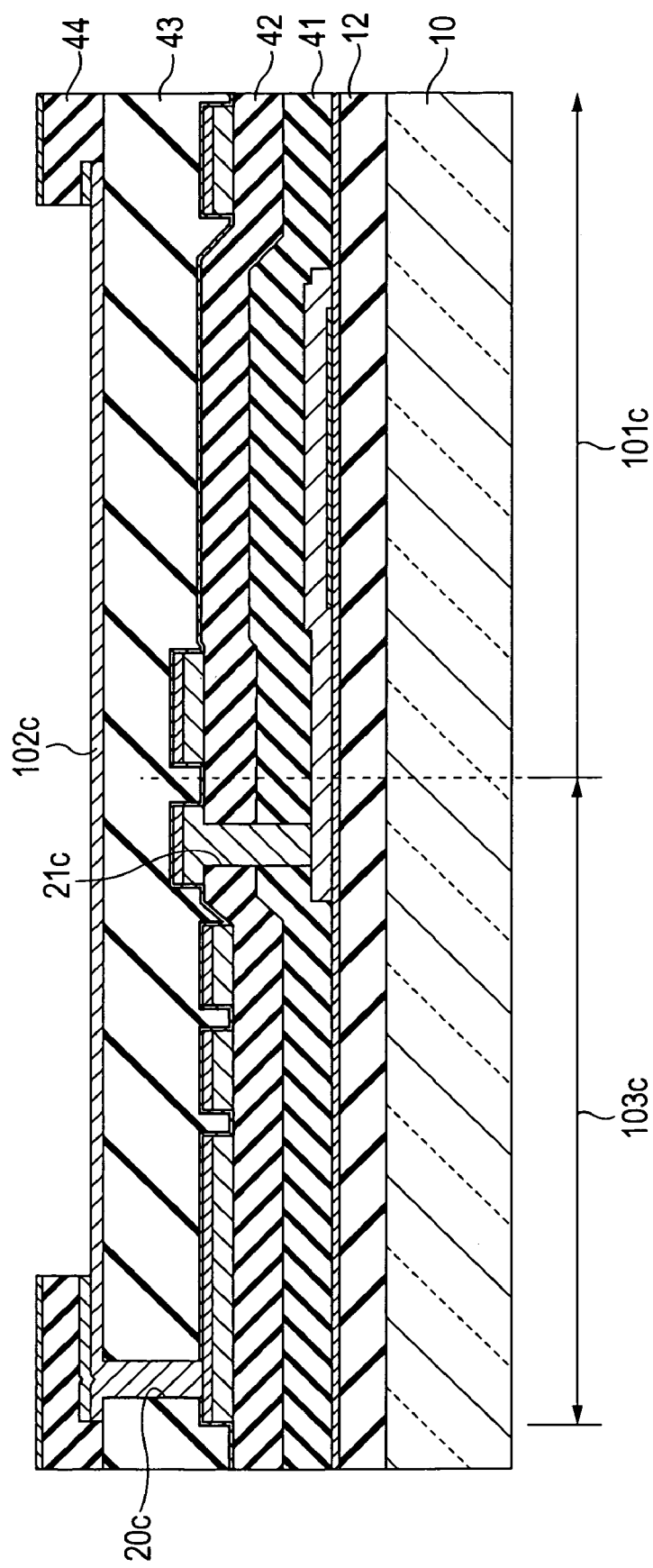
FIG. 13 is a cross-sectional view showing an extending portion taken along the line XIII-XIII of FIG. 12.

Next, a liquid crystal device according to a second embodiment will be described with reference to FIGS. 11 to 13. FIG. 11 shows the schematic configuration of the liquid crystal device according to the present embodiment, FIG. 12 shows main parts of an extending portion in the liquid crystal device according to the second embodiment on a magnified scale, and FIG. 13 is a cross-sectional view taken along the line XIII-XIII of FIG. 12. In addition, the liquid crystal device 100A has the same configuration as the liquid crystal device 100, except that the arrangement within the extending portion is different. Therefore, the same parts as those in the liquid crystal device 100 are denoted by the same reference numerals and the detailed descriptions thereof will be omitted.

In FIG. 11, in the liquid crystal device 100A, a data line driving circuit 101c and lead wiring lines 103c are disposed to overlap a plurality of external connecting terminals 102c, which are arranged along the outer edge of an extending portion 202, in plan view. With the design of the layout of the extending portion 202, the width L12 of the extending portion 202 can be made narrow to thereby reduce the size of the TFT array substrate 10, such that the same effects as those in the first embodiment can be obtained.

FIGS. 12 and 13 show that mode on a magnified scale. The lead wiring lines 103c are connected to the external connecting terminals 102c via contact holes 20c provided in regions where the lead wiring lines 103c and the external connecting terminals 102c intersect each other, in the same manner as that in the modification of the first embodiment. On the other hand, each of the lead wiring lines 103c is connected to the data line driving circuit 101c via the contact hole 21c provided in a region where each of the lead wiring lines 103c extends.

Here, in a structure laminated on the TFT array substrate 10, the lead wiring lines 103c are provided in the fourth layer, the external connecting terminals 102c are provided in the fifth layer, and the contact holes 20c are provided to pass through the interlayer insulating film 43. The data line driving circuit 101c is provided in at least one (second and fourth layers in the range shown in the drawing) of the first to fifth layers, and the contact holes 20c are provided to pass through the interlayer insulating films 41 and 42.

In the present embodiment, the external connecting terminals 102c and the lead wiring lines 103c are formed as the same film as the conductive film for the data line driving circuit 101c or a circuit unit in the image display region 10a or are formed as a part of the same film as the conductive film, so that the structure on the TFT array substrate 10 can be simplified and relatively easily formed. Other advantages and effects of the second embodiment are the same as those of the first embodiment, and the modification of the first embodiment can also be made in the present embodiment.

Figure 14:
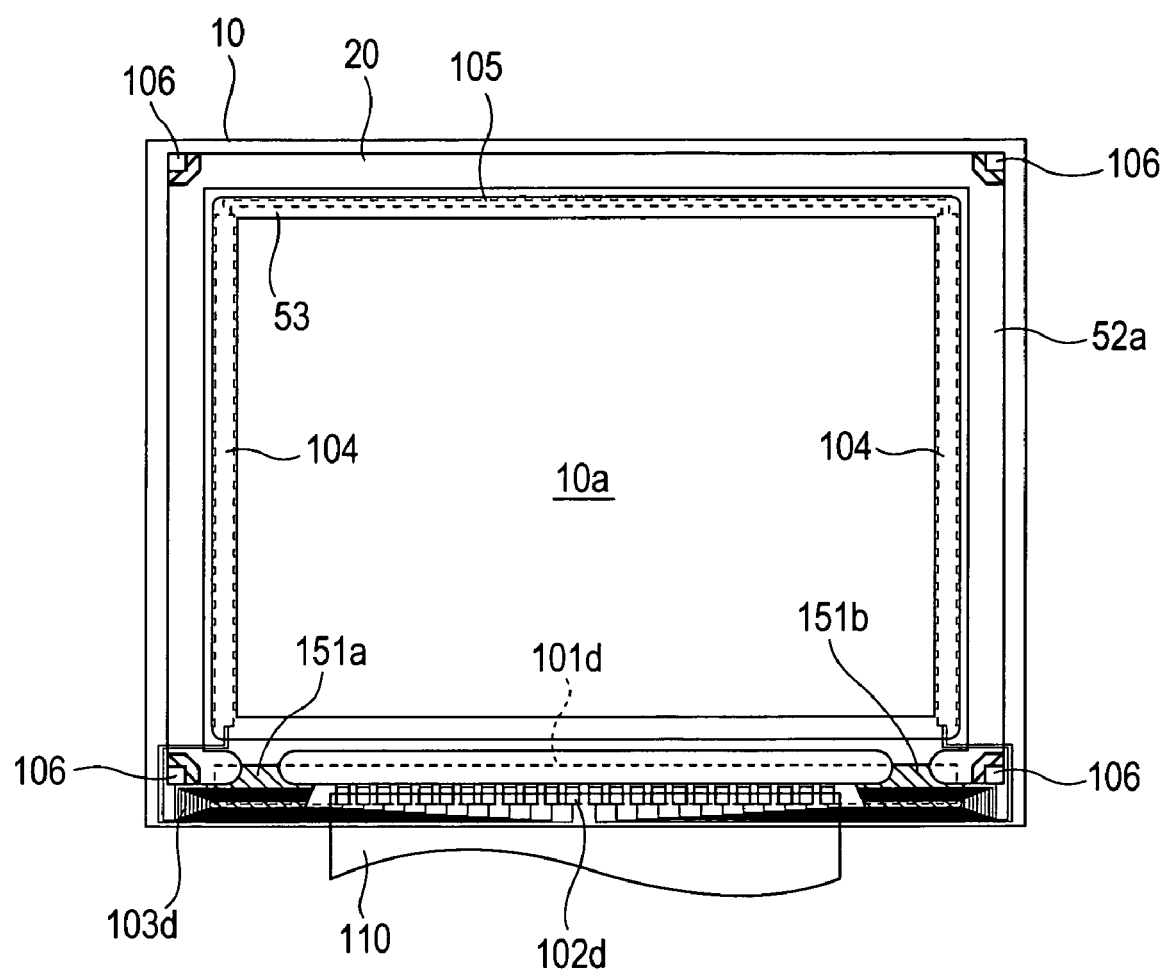
FIG. 14 is a plan view showing a modification of the liquid crystal device according to the second embodiment.

Further, though the external connecting terminals 102c and the lead wiring lines 103c overlap each other in plan view and the external connecting terminals 102c and the data line driving circuit 101c overlap each other in plan view in the second embodiment, the width of the extending portion can be reduced in a layout in which only the data line driving circuit overlaps the external connecting terminals, as shown in FIG. 14, and thus the effects of the invention can be obtained.

Electronic Apparatus

Figure 15:
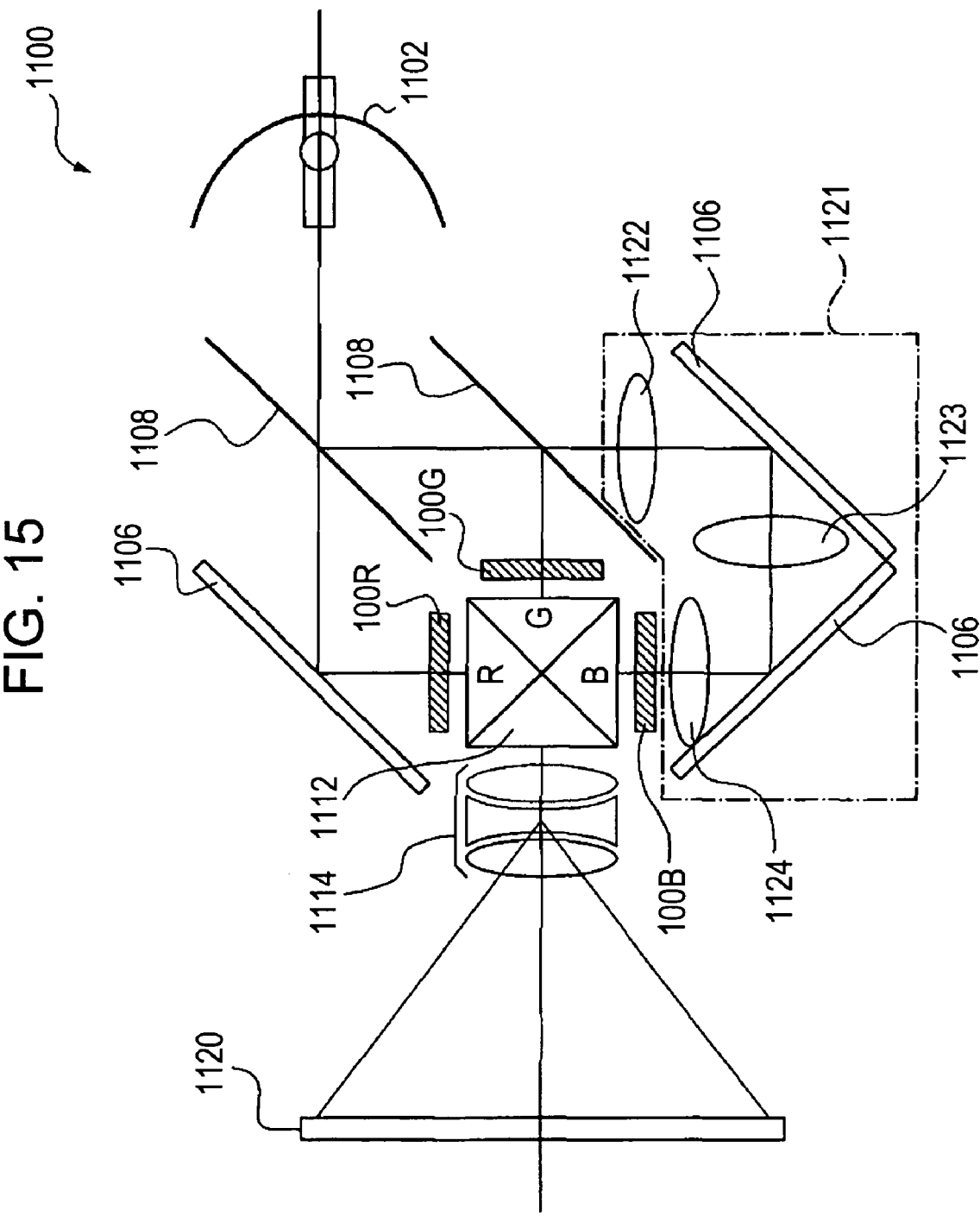
FIG. 15 is a cross-sectional view showing a configuration of a liquid crystal projector according to an embodiment of an electronic apparatus of the invention.

Next, a case in which the above-described liquid crystal device is applied to an electronic apparatus will be described with reference to FIG. 15. Here, a projector which uses the liquid crystal device 100 as a light valve will be described as an example of the electronic apparatus according to the invention. FIG. 15 shows an example of a configuration of the projector.

In FIG. 15, a liquid crystal projector 1100 includes a lamp unit 1102 having a white light source, such as a halogen lamp. Projection light emitted from the lamp unit 1102 is separated into light components of three primary colors of R (red), G (green), and B (blue) by three mirrors 1106 and two dichroic mirrors 1108, and the light components of three primary colors are incident on liquid crystal devices 100R, 100G, and 100B, serving as light valves, corresponding to the respective colors of R, G, and B. The configurations of each of the liquid crystal devices 100R, 100G, and 100B is the same as that of the above-described liquid crystal device, and three primary color signals supplied from an image signal processing circuit are modulated by the liquid crystal devices 100R, 100G, and 100B, respectively. The light components of three primary colors modulated by the liquid crystal devices 100R, 100G, and 100B are incident on a dichroic prism 1112 from three directions. Then, images, each having one of the light components for three primary colors, are synthesized, such that a color image is projected onto a screen 1120 through a projection lens 1114.

In addition, the electro-optical device according to the invention may be implemented as an organic EL device, an electrophoretic device, such as an electronic paper or the like, a display device using an electron emission element (Field Emission Display and Surface-Conduction Electron-Emitter Display), and the like, in addition to the above-described liquid crystal device.

Further, the electro-optical device according to the invention can be applied to various electronic apparatuses, such as a television receiver, a viewfinder-type or monitor-direct-view-type video tape recorder, a car navigation device, a pager, an electronic organizer, an electronic calculator, a word processor, a workstation, a video phone, a POS terminal, a device having a touch panel, and the like, in addition to the above-described projector.

It should be understood that the invention is not limited to the above-described embodiments and examples, but various modifications can be made within the scope without departing from the subject matter or spirit of the invention defined by the appended claims and the entire specification. Therefore, an electro-optical device and an electronic apparatus having such an electro-optical device that accompany such modifications still fall within the technical scope of the invention.

What is claimed is:

1. An electro-optical device comprising:
   a pair of substrates that are disposed to face each other with a predetermined gap therebetween, one substrate of the pair of substrates including an extending portion that extends from the other substrate on one side in plan view;
   display electrodes that are provided on the one substrate;
   a circuit unit that is provided on the one substrate so as to drive the display electrodes;
   wiring lines for driving the circuit unit and the display electrodes;
   a plurality of lead wiring lines provided on the extending portion and that are led from one of the sides of the wiring lines to the extending portion; and
   a plurality of external connecting terminals provided on the extending portion, each of the external connecting terminals overlapping with the plurality of lead wiring lines in plan view.

2. The electro-optical device according to claim 1,
   wherein the external connecting terminals and the lead wiring lines are laminated with an interlayer insulating film interposed therebetween, each of the external connecting terminals being electrically connected with a corresponding one of the lead wiring lines and being electrically isolated from others of the plurality of lead wiring lines by the interlayer insulating film.

3. The electro-optical device according to claim 1,
   wherein the plurality of external connecting terminals are arranged in a direction along the one side, and
   the plurality of lead wiring lines extend in the direction along the one side and are correspondingly connected to edges of the external connecting terminals in a direction intersecting the direction along the one side.

4. The electro-optical device according to claim 1,
   wherein the plurality of external connecting terminals are arranged in a direction along the one side, and the plurality of lead wiring lines extend in the direction along the one side and are correspondingly connected to the external connecting terminals in a region where the lead wiring lines and the external connecting terminals intersect each other in plan view.

5. An electro-optical device comprising:
a pair of substrates that are disposed to face each other with a predetermined gap therebetween, one substrate of the pair of substrates including an extending portion that extends from the other substrate on one side in plan view;
display electrodes that are provided on the one substrate;
a circuit unit that is provided on the one substrate so as to drive the display electrodes;
wiring lines for driving the circuit unit and the display electrodes;
a plurality of lead wiring lines provided on the extending portion and that are led from one of the sides of the wiring lines to the extending portion; and
a plurality of external connecting terminals provided on the extending portion, each of the external connecting terminals overlapping with the circuit unit in plan view.

6. The electro-optical device according to claim 5, wherein the circuit unit is electrically connected to terminals for supplying an image signal among the plurality of external connecting terminals and has a driving circuit, which is driven by the supplied image signal, and
at least a part of the driving circuit overlaps the external connecting terminals in plan view.

7. The electro-optical device according to claim 5, wherein the external connecting terminals and the part of the circuit unit are laminated with an interlayer insulating film interposed therebetween, each of the external connecting terminals being electrically connected with a corresponding one of the lead wiring lines and being electrically isolated from others of the plurality of lead wiring lines by the interlayer insulating film.

8. The electro-optical device according to claim 1, further comprising:
a sealant that bonds edges of opposite surfaces of the pair of substrates to each other so as to form an internal space between the pair of substrates; and
an electro-optical material that is held in the internal space,
wherein the display electrodes and a part of the circuit unit are disposed to face the internal space.

9. An electronic apparatus comprising the electro-optical device according to claim 1.

10. The electro-optical device according to claim 2, the external connecting terminals being formed from the same film as a first conductive film constituting the circuit unit, and the lead wiring lines being formed from the same film as a second conductive film constituting the circuit unit.

11. The electro-optical device according to claim 7, the external connecting terminals being formed from the same film as a first conductive film constituting the circuit unit.

* * * * *